United States Patent
Suenaga et al.

(10) Patent No.: US 9,299,911 B2
(45) Date of Patent: Mar. 29, 2016

(54) PIEZOELECTRIC THIN-FILM MULTILAYER BODY

(71) Applicant: Hitachi Metals, Ltd., Tokyo (JP)

(72) Inventors: Kazufumi Suenaga, Tsuchiura (JP); Kenji Shibata, Tsukuba (JP); Kazutoshi Watanabe, Tsuchiura (JP); Fumimasa Horikiri, Nagareyama (JP); Masaki Noguchi, Tsuchiura (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 191 days.

(21) Appl. No.: 14/223,916

(22) Filed: Mar. 24, 2014

(65) Prior Publication Data

US 2014/0285069 A1    Sep. 25, 2014

(30) Foreign Application Priority Data

Mar. 25, 2013  (JP) ................. 2013-061208

(51) Int. Cl.
*H01L 41/08* (2006.01)
*H01L 41/187* (2006.01)

(52) U.S. Cl.
CPC .......... *H01L 41/0805* (2013.01); *H01L 41/081* (2013.01); *H01L 41/1873* (2013.01)

(58) Field of Classification Search
CPC ............ H01L 41/1873; H01L 41/0805; H01L 41/081

USPC ............ 310/358, 363, 357, 311; 252/62.9 R, 252/62.9 PZ; 501/135

See application file for complete search history.

(56) References Cited

U.S. PATENT DOCUMENTS

| 8,058,779 B2 | 11/2011 | Suenaga et al. | |
| 2007/0024162 A1* | 2/2007 | Shibata et al. | 310/358 |
| 2007/0236404 A1* | 10/2007 | Snider et al. | 343/872 |
| 2008/0012909 A1* | 1/2008 | Matsuda et al. | 310/311 |

FOREIGN PATENT DOCUMENTS

| JP | 2000-285626 A | 10/2000 |
| JP | 2007-019302 A | 1/2007 |
| JP | 2010-161330 A | 7/2010 |

* cited by examiner

*Primary Examiner* — Thomas Dougherty
*Assistant Examiner* — Karen B Addison
(74) *Attorney, Agent, or Firm* — McGinn IP Law Group, PLLC (57) ABSTRACT

A piezoelectric thin-film multilayer body includes a substrate, an adhesive layer on the substrate, a lower electrode layer on the adhesive layer, and a lead-free piezoelectric thin-film layer on the lower electrode layer. The lead-free piezoelectric thin-film layer is composed of lithium potassium sodium niobate (composition formula $(Na_xK_yLi_z)NbO_3$, $0<x<1$, $0<y<1$, $0 \le z \le 1$, $x+y+z=1$). The maximum height Rz of a roughness of an adhesive-layer-facing surface of the substrate is 2 nm or less. The adhesive layer is composed of a non-crystalline oxide of a Group 4 element or a non-crystalline oxide of a Group 5 element. The adhesive layer has a thickness of 1 nm or more and 2 nm or less and is equal to or more than the maximum height Rz of the roughness of the surface of the substrate.

9 Claims, 5 Drawing Sheets

PIEZOELECTRIC THIN-FILM MULTILAYER BODY

The present application is based on Japanese patent application No. 2013-061208 filed on Mar. 25, 2013, the entire contents of which are incorporated herein by reference.

BACKGROUND OF THE INVENTION

1. Field of the Invention

The present invention relates to piezoelectric thin-film devices and particularly relates to a piezoelectric thin-film multilayer body including a lead-free piezoelectric material.

2. Description of the Related Art

A piezoelectric device is a device that utilizes the piezoelectric effect of a piezoelectric material and has been widely used as a functional electronic part such as an actuator that generates a displacement or a vibration upon the application of a voltage to a piezoelectric material or a stress sensor that generates a voltage upon the deformation of a piezoelectric material caused by a stress applied thereto. Hitherto, a lead zirconate titanate-based perovskite-type ferroelectric (composition formula: $Pb(Zr_{1-x}Ti_x)O_3$, referred to as "PZT"), which has a good piezoelectric property, has been widely used as a piezoelectric material used for an actuator or a stress sensor.

PZT is a specified hazardous substance containing lead but is exempt from the Directive of the European Parliament and of the Council on the restriction of the use of certain hazardous substances in electrical and electronic equipment (RoHS directive) because, at present, there is no commercially available alternative to PZT that could be suitably used as a piezoelectric material. There has been a growing international demand for global environmental conservation, and accordingly development of a piezoelectric device including a piezoelectric material containing no lead (i.e., lead-free piezoelectric material) is strongly anticipated.

On the other hand, as a result of recent progress in the reduction in size of and enhancement of the functionality of various electronic equipment, there has been also a demand for both a reduction in the size of and enhancement of the functionality of piezoelectric devices. In an existing piezoelectric device produced by a powder sintering method, when the thickness of the piezoelectric material is 10 μm or less, it becomes impossible to ignore the effect of the crystal grain boundaries on the piezoelectric property because the thickness of the piezoelectric material is comparable to the size of the crystal grains constituting the piezoelectric material. Specifically, the positional relationship between an electrode and a crystal grain boundary and the density of the crystal grain boundaries vary among sintered piezoelectric materials, which results in significant variations among the piezoelectric properties of piezoelectric devices. In response to these issues on the reduction in size (i.e., reduction in thickness) of a piezoelectric device, there has recently been proposed a piezoelectric thin-film device produced by utilizing a thin-film deposition technique instead of a powder sintering method.

An example of a piezoelectric thin-film device including a lead-free piezoelectric material is a piezoelectric thin-film device disclosed in Japanese Unexamined Patent Application Publication No. 2007-019302 (hereinafter, referred to as "PTL 1"), which includes a lower electrode, a piezoelectric thin film, and an upper electrode stacked on or above a substrate. The piezoelectric thin film is a dielectric thin film composed of an alkaline niobium oxide-based perovskite compound represented by the following general formula $(Na_xK_yLi_z)NbO_3$ ($0<x<1$, $0<y<1$, $0 \leq z<1$, $x+y+z=1$). The piezoelectric thin-film device further includes, as a buffer layer interposed between the piezoelectric thin film and the lower electrode, a thin film composed of a material that has a perovskite-type crystal structure and is likely to be oriented in the direction of the (001), (100), (010), or (111) plane with a high degree of orientation. According to PTL 1, the piezoelectric thin-film device including a lead-free, lithium potassium sodium niobate thin film produces a sufficiently good piezoelectric property.

Generally, the size of crystal grains in a piezoelectric thin-film device, which is produced by utilizing a thin-film deposition technique, is very small. Therefore, the deviation of the density of the crystal grain boundaries of the piezoelectric thin film is small, which reduces the variations in piezoelectric property due to the presence or absence of a crystal grain boundary. On the other hand, since the size of the crystal grains is small and the number thereof is large, the orientation of crystal grains (i.e., degree of crystal orientation in the piezoelectric thin film) greatly affects the piezoelectric property and the reliability (e.g., variations and service life) of the device. Generally, the orientation of a thin film deposited on or above a substrate is likely to be affected by the base material.

An example of a technique for enhancing the piezoelectric property of a piezoelectric thin-film device is a piezoelectric thin-film device disclosed in Japanese Unexamined Patent Application Publication No. 2010-161330 (hereinafter, referred to as "PTL 2"), which includes a lower electrode, a piezoelectric layer, and an upper electrode stacked on or above a substrate. The piezoelectric layer includes a lead-free niobium oxide-based perovskite-type crystal as a main phase. The lower electrode has a surface roughness of 1.1 nm or less in terms of root-mean-square roughness Rms. According to PTL 2, a piezoelectric thin-film device having a good piezoelectric property can be realized by controlling the surface roughness of the lower electrode to be in a specific range.

Japanese Unexamined Patent Application Publication No. 2000-285626 (hereinafter, referred to as "PTL 3") discloses a piezoelectric thin film including a substrate having a surface roughness (Ra) of 0.05 μm or less and a piezoelectric thin film deposited on the substrate. According to PTL 3, a high-performance piezoelectric thin-film device can be realized by controlling the smoothness of the substrate surface and thereby improving the piezoelectric property of the piezoelectric thin film.

SUMMARY OF THE INVENTION

In order to encourage widespread adoption of piezoelectric thin-film devices including a lead-free piezoelectric material as a true replacement for existing PZT piezoelectric devices, there have been strong demands for further improvements of piezoelectric property and reliability and cost reduction. However, currently, there are still many points that have not yet been clarified in terms of multilayer-structure control and production-process control since the field of piezoelectric thin-film devices concerns a relatively new technology. Thus, it may be impossible to utilize the true piezoelectric property of a lead-free piezoelectric material. In another case, there may be an issue of variations in the piezoelectric property or an issue of an increase in production cost.

For example, the technique described in PTL 2 includes a surface-polishing step in order to control the surface roughness of the lower electrode to be within a specific range, which disadvantageously incurs a processing cost and causes a material loss of the lower electrode. A study conducted by the inventors of the present invention with reference to the technique described in PTL 3 showed that the effect of enhancing piezoelectric property was not sufficiently large.

Accordingly, in order to address the above-described issues, an object of the present invention is to provide a piezoelectric thin-film multilayer body including a lead-free piezoelectric material with which a piezoelectric thin-film device having a good piezoelectric property with small variations among devices may be produced.

(I) According to an aspect of the present invention, a piezoelectric thin-film multilayer body includes a substrate; an adhesive layer on the substrate; a lower electrode layer on the adhesive layer; and a lead-free piezoelectric thin-film layer on the lower electrode layer. The lead-free piezoelectric thin-film layer is composed of lithium potassium sodium niobate (composition formula $(Na_xK_yLi_z)NbO_3$, $0<x<1$, $0<y<1$, $0 \leq z \leq 1$, $x+y+z=1$). The maximum height Rz of the roughness of the adhesive-layer-facing surface of the substrate is 2 nm or less. The adhesive layer is composed of a non-crystalline oxide of a Group 4 element or a non-crystalline oxide of a Group 5 element. The adhesive layer has a thickness of 1 nm or more and 2 nm or less and is equal to or more than the maximum height Rz of the roughness of the surface of the substrate. Note that, the term "roughness of a surface" used herein is defined in accordance with JIS B0601:2001. The term "roughness of a surface of a substrate" refers to, in the state where an adhesive layer is formed on a substrate, the roughness of the interface between the substrate and the adhesive layer. The term "thickness of an adhesive layer" refers to the average thickness of the adhesive layer measured by X-ray reflectometry.

(II) According to an another aspect of the present invention, a piezoelectric thin-film multilayer body includes a substrate; an adhesive layer on the substrate; a lower electrode layer on the adhesive layer; and a lead-free piezoelectric thin-film layer on the lower electrode layer. The lead-free piezoelectric thin-film layer is composed of a ferroelectric having a perovskite structure. The maximum height Rz of the roughness of the adhesive-layer-facing surface of the substrate is 2 nm or less. The adhesive layer is composed of a non-crystalline oxide of a Group 4 element or a non-crystalline oxide of a Group 5 element. The adhesive layer has a thickness of 1 nm or more and 2 nm or less and is equal to or more than the maximum height Rz of the roughness of the surface of the substrate.

The following modifications and alternations may be applied to the piezoelectric thin-film multilayer bodies described in (I) and (II).

(i) The arithmetic average roughness Ra of the roughness of the surface of the substrate is 0.18 nm or less.

(ii) The lower electrode layer has a (111) preferred orientation.

(iii) The Group 4 element included in the adhesive layer is titanium (Ti).

(iv) The lower electrode layer is composed of platinum (Pt) or a Pt alloy.

(v) The substrate is any one selected from a silicon (Si) substrate, a silicon-on-insulator (SOI) substrate, a germanium (Ge) substrate, a magnesium oxide (MgO) substrate, a zinc oxide (ZnO) substrate, a strontium titanate ($SrTiO_3$) substrate, a strontium ruthenate ($SrRuO_3$) substrate, a sapphire ($Al_2O_3$) substrate, a gallium arsenide (GaAs) substrate, a gallium nitride (GaN) substrate, a glass substrate, and a quartz glass substrate.

(III) According to another aspect of the present invention, a piezoelectric thin-film device includes the above-described piezoelectric thin-film multilayer body.

According to an embodiment of the present invention, a piezoelectric thin-film multilayer body including a lead-free piezoelectric material, with which a piezoelectric thin-film device having a good piezoelectric property with small variations among devices may be produced, is provided. Furthermore, a piezoelectric thin-film device having a good piezoelectric property with small variations among devices may be provided by utilizing the piezoelectric thin-film multilayer body.

BRIEF DESCRIPTION OF THE DRAWINGS

The foregoing and other exemplary purposes, aspects and advantages will be better understood from the following detailed description of the invention with reference to the drawings, in which.

DESCRIPTION OF THE PREFERRED EMBODIMENTS

Referring now to the drawings, and more particularly to FIGS. 1-8, there are shown exemplary embodiments of the methods and structures according to the present invention.

The inventors of the present invention have focused on LKNN (($Na_xK_yLi_z)NbO_3$) as a lead-free piezoelectric material having a piezoelectric property comparable to that of PZT ($Pb(Zr_{1-x}Ti_x)O_3$) and conducted extensive studies on properties of the structure of piezoelectric thin-film multilayer body which are to be controlled in order to achieve the enhancement of the piezoelectric property of the piezoelectric thin-film device and a reduction in variations in the piezoelectric property. As a result, the inventors have found the following tendencies: the smaller the thickness of the adhesive layer, the higher the degree of crystal orientation of the piezoelectric thin-film layer; and the smaller the thickness of the adhesive layer, the larger the variations in the degree of crystal orientation. The inventors have contemplated the factor and conducted further studies on the effect of the surface roughness of a substrate and, as a result, found that the degree of crystal orientation of a piezoelectric thin-film layer may be further increased and the variations in the degree of crystal orientation may be reduced by controlling the thickness of an adhesive layer within a specific range and controlling the surface roughness (particularly, maximum height Rz) of a substrate to be equal to or greater than the thickness of an adhesive layer. The present invention has made on the basis of the above-described findings.

Embodiments of the present invention are described below in detail with reference to the attached drawings. However, the present invention is not limited to the following embodiments and may be combined or modified appropriately without departing the technical idea of the present invention.

Figure 1:
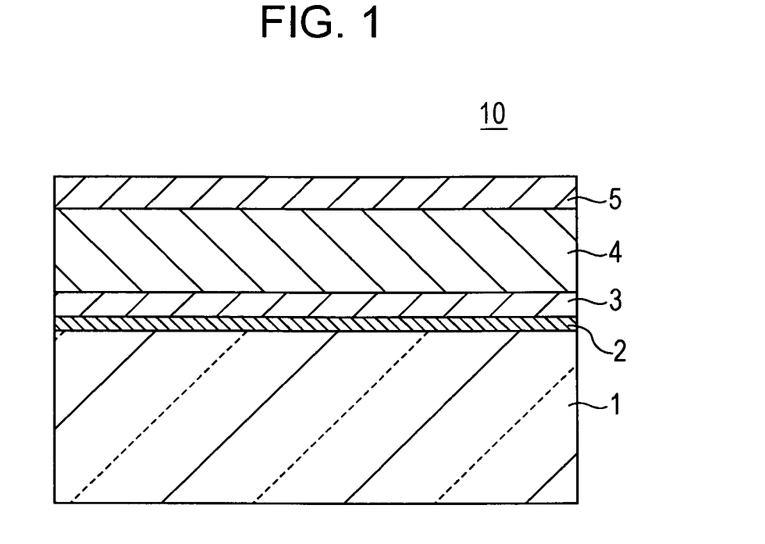
FIG. 1 is a schematic cross-sectional view of a piezoelectric thin-film multilayer body according to an embodiment of the present invention.

FIG. 1 is a schematic cross-sectional view of the piezoelectric thin-film multilayer body according to the embodiment. As shown in FIG. 1, a piezoelectric thin-film multilayer body 10 according to the embodiment includes a substrate 1, an adhesive layer 2 on the substrate 1, a lower electrode layer 3 on the adhesive layer 2, a piezoelectric thin-film layer 4 on the lower electrode layer 3, and an upper electrode layer 5 on the piezoelectric thin-film layer 4. The piezoelectric thin-film device according to the embodiment may be produced by cutting the piezoelectric thin-film multilayer body 10 into a chip having a desired shape. The upper electrode layer 5 may be formed during the formation of the piezoelectric thin-film multilayer body 10 or may be formed after the piezoelectric thin-film multilayer body 10 is cut into a chip having a desired shape.

The piezoelectric thin-film multilayer body 10 is specifically described in accordance with its production steps described below.

A substrate 1 is prepared. The material of the substrate 1 is not particularly limited and may be selected depending on the application of the piezoelectric device. The substrate 1 may be, for example, a silicon (Si) substrate, a silicon-on-insulator (SOI) substrate, a germanium (Ge) substrate, a magnesium oxide (MgO) substrate, a zinc oxide (ZnO) substrate, a strontium titanate ($SrTiO_3$) substrate, a strontium ruthenate ($SrRuO_3$) substrate, a sapphire ($Al_2O_3$) substrate, a gallium arsenide (GaAs) substrate, a gallium nitride (GaN) substrate, a glass substrate, or a quartz glass substrate. Among these substrates, it is preferable to use a Si substrate in terms of cost. When the substrate 1 is composed of a conductive material, the surface of the substrate 1 is preferably coated with an electrical insulating film (e.g., oxide film). A method for forming the oxide film is not particularly limited. Thermal oxidation process, chemical vapor deposition (CVD), and the like may be suitably employed.

According to the embodiment, the maximum height Rz of the roughness of the adhesive-layer-2-facing surface of the substrate 1 is 2 nm or less. The maximum height Rz of the roughness of the surface of the substrate 1 is more preferably less than 2 nm. The arithmetic average roughness Ra of the roughness of the surface of the substrate 1 is preferably 0.2 nm or less. Although the arithmetic average roughness Ra has been commonly used as a measure of surface roughness, as a result of the studies conducted by the inventors of the present invention, it was found that the maximum height Rz is more important.

A sufficiently good surface flatness of the adhesive layer 2 may be maintained by controlling the surface roughness of the substrate 1 to be within the above range even when the thickness of adhesive layer 2 formed on the substrate 1 is reduced. As a result, the properties of the lower electrode layer 3 (e.g., the degree of (111) orientation) become stable, and consequently the degree of crystal orientation and the piezoelectric property of the piezoelectric thin-film layer 4 may be enhanced. The specific operation and effect produced by controlling the surface roughness of the substrate 1 are described below in detail. The term "surface roughness" used herein refers to a surface roughness determined in accordance with JIS B0601:2001 and can be determined with an atomic force microscope (AFM) or the like.

A method for controlling the surface of the substrate 1 is not particularly limited as long as a substrate having a desired surface roughness (surface flatness) can be produced with the method, and any existing method may be employed. In this embodiment, although the substrate-surface flattening process incurs an extra process cost, by using the substrate according to the embodiment, the steps of forming layers stacked on or above the substrate 1 (i.e., adhesive layer 2, lower electrode layer 3, piezoelectric thin-film layer 4) can be continuously performed while a controlled atmosphere is maintained (in other word, e.g., without breaking a vacuum condition). This greatly contributes to a reduction in the total production cost.

The adhesive layer 2 is formed on the substrate 1. The adhesive layer 2 is preferably composed of an oxide of a Group 4 element (i.e., titanium group element such as titanium (Ti), zirconium (Zr), or hafnium (Hf)) or an oxide of Group 5 element (i.e., vanadium group element such as vanadium (V), niobium (Nb), or tantalum (Ta)) from the viewpoints of adhesion and environment resistance. The adhesive layer 2 is preferably an oxide layer being in the non-crystalline state (glassy state). The adhesive layer 2 being in the non-crystalline state (glassy state) does not have any specific orientation on the surface thereof and has good surface flatness.

The thickness of the adhesive layer 2 is preferably 1 nm or more and 2 nm or less and is more preferably 1 nm or more and less than 2 nm. If the thickness of the adhesive layer 2 is less than 1 nm, it becomes difficult to form the adhesive layer 2 as a continuous layer (in other words, an adhesive layer is likely to be formed in the form of islands), which results in degradation of surface flatness. On the other hand, if the thickness of the adhesive layer 2 exceeds 2 nm, the variations in the degree of crystal orientation of the piezoelectric thin-film layer 4 formed above the adhesive layer 2 and the variations in the piezoelectric property of the piezoelectric thin-film layer 4 are increased.

The mechanism responsible for the increase in the variations has not yet been clarified, but it is considered, as one of the factors, that, if the thickness of the adhesive layer 2 is increased, it becomes difficult to maintain the non-crystalline state (glassy state) (in other words, a portion of the adhesive layer 2 starts crystallizing). As a result, portions having a high degree of crystal orientation and portions having a low degree of crystal orientation are present in a mixed manner, which results in large variations in the degree of crystal orientation. On the other hand, if the thickness of the adhesive layer 2 is further increased and consequently the entire portion of the adhesive layer 2 is crystallized, it is considered that the degree of crystal orientation becomes stable at a low value (in other words, variations in the degree of crystal orientation become small).

A method for forming the adhesive layer 2 is not particularly limited as long as a desired adhesive layer is produced with the method. Physical vapor deposition (e.g., sputtering, thermal deposition, or electron-beam evaporation) may be suitably employed. Sputtering is preferably employed from the viewpoint of production cost. In particular, it is preferable to employ a method of forming a non-crystalline oxide film in which a metal target is used and an oxygen component is introduced during the formation of the film.

The thickness of the adhesive layer can be determined on the basis of the oscillation period calculated from the X-ray reflectivity profile (X-ray reflection intensity profile) determined by X-ray reflectometry. It is possible to confirm that the adhesive layer 2 is a non-crystalline oxide layer by calculating the density of the adhesive layer on the basis of the total reflection critical angle obtained from the X-ray reflection intensity profile and then comparing the density of the adhesive layer with the density of titanium metal and the density of crystalline Ti oxide.

The lower electrode layer 3 is formed on the adhesive layer 2. The material of the lower electrode layer 3 is not particularly limited and is preferably platinum (Pt), a Pt alloy (an alloy containing Pt as a main component), or the like. Alternatively, ruthenium (Ru), iridium (Ir), tin (Sn), indium (In), and oxides of these metals may also be used. The lower electrode layer 3 may have a single-layer structure constituted by one of the above materials or a multilayer structure including layers each composed of one of the above materials.

The lower electrode layer 3, which serves as a base layer of the piezoelectric thin-film layer 4, preferably has the (111) preferred orientation in order to increase the degree of crystal orientation of the piezoelectric thin-film layer 4. The lower electrode layer 3 preferably has an aggregate structure constituted by columnar crystal grains. A method for forming the lower electrode layer 3 is not particularly limited as long as a desired lower electrode layer can be produced. Physical vapor deposition (e.g., sputtering, thermal deposition, or electron-beam evaporation) may be suitably employed.

The piezoelectric thin-film layer 4 is formed on the lower electrode layer 3. In this embodiment, the piezoelectric thin-film layer 4 is preferably composed of lithium potassium sodium niobate (composition formula ($Na_x K_y Li_z$)$NbO_3$, $0<x<1$, $0<y<1$, $0\leq z\leq 1$, $x+y+z=1$) (hereinafter, referred to as "LKNN"), which is a lead-free piezoelectric material and preferably has the (001) preferred orientation. LKNN having the (001) orientation exhibits the best piezoelectric property.

A method for forming the piezoelectric thin-film layer 4 is not particularly limited as long as a desired piezoelectric thin-film layer can be formed with the method. Sputtering using a sintered body having a desired composition, electron-beam evaporation, and pulsed laser deposition may be suitably employed. These film deposition methods advantageously produces good composition controllability and good crystal orientation controllability.

The technical idea according to the present invention is not limited to use of a piezoelectric thin-film layer 4 composed of LKNN but can also be applied to use of a piezoelectric thin-film layer 4 composed of another ferroelectric that is a lead-free piezoelectric material and has a perovskite structure (e.g., barium titanate ($BaTiO_3$) or a Bi compound having a layer structure).

The upper electrode layer 5 is formed on the piezoelectric thin-film layer 4. The material of the upper electrode layer 5 is not particularly limited. The above-described materials of the lower electrode layer 3, aluminium (Al), gold (Au), and nickel (Ni) may be suitably used as the material of the upper electrode layer 5. A method for forming the upper electrode layer 5 is also not particularly limited. Physical vapor deposition (e.g., sputtering, thermal deposition, and electron-beam evaporation) may be suitably employed as in the formation of the lower electrode layer 3.

EXAMPLES

The present invention is specifically described with reference to Examples below. However, the invention is not limited to these Examples.

Study 1

Study 1 examined how the structure of the adhesive layer of the piezoelectric thin-film multilayer body affects the degree of crystal orientation of the piezoelectric thin-film layer.

Preparation of Piezoelectric Thin-Film Multilayer Body

A piezoelectric thin-film multilayer body including a substrate 1, an adhesive layer 2, a lower electrode layer 3, and a piezoelectric thin-film layer 4, that is, the same one as the piezoelectric thin-film multilayer body 10 shown in FIG. 1 except that the upper electrode layer 5 was omitted, was prepared. The substrate used was a Si substrate including a thermal oxide film ((100)-oriented 4-inch wafer, wafer thickness of 0.525 mm, thermal oxide film thickness of 200 nm).

The Si substrate including a thermal oxide film was subjected to surface polishing to prepare a substrate 1. The surface roughness of the substrate was measured by scanning a 1 μm×1 μm region with a pitch of 4 nm using atomic force microscope (AFM) "NanoScope IIIa" produced by Digital Instruments, Inc. (currently Veeco Instruments, Inc.). The arithmetic average roughness Ra and maximum height Rz of the surface roughness of the substrate were 0.58 nm and 7.5 nm, respectively.

In the following film-deposition process, the thickness of each layer (i.e., adhesive layer 2, lower electrode layer 3, or piezoelectric thin-film layer 4) was controlled by changing the film-deposition time on the basis of a predetermined film-deposition rate. The thicknesses of the layers were measured by X-ray reflectometry using an X-ray diffractometer (produced by Spectris Co., Ltd. (PANalytical Div.), model: X'Pert PRO MRD).

An adhesive layer 2 (thickness 1 to 4.9 nm) was formed on the substrate 1 by radio frequency (RF) magnetron sputtering using a Ti target (purity of 2 to 4 N, diameter of 200 mm) with an input power of 600 W and a substrate temperature of 200° C. in an argon (Ar) and oxygen ($O_2$) mixed-gas atmosphere at a pressure of 7.0 Pa.

A lower electrode layer 3 (thickness of 200 nm) was formed on the adhesive layer 2 by RF magnetron sputtering using a Pt target (purity of 4 N, diameter of 200 mm) with an input power of 200 W and a substrate temperature of 250° C. in an Ar atmosphere at a pressure of 2.5 Pa.

A piezoelectric thin-film layer 4 (thickness of 2 μm) was formed on the lower electrode layer 3 by RF magnetron sputtering using a KNN sintered body target (($Na_{0.5}K_{0.5}$)$NbO_3$, diameter of 200 mm) with an input power of 700 W and a substrate temperature of 520° C. in an Ar and $O_2$ mixed-gas atmosphere at a pressure of 1.3 Pa.

Preferred Orientations of Lower Electrode Layer and Piezoelectric Thin-Film Layer The piezoelectric thin-film multilayer body on which the piezoelectric thin-film layer 4 has been formed was subjected to an X-ray diffraction (XRD) measurement. The XRD measurement was carried out using a multifunctional high-resolution X-ray diffractometer (produced by Bruker AXS K.K., model: D8 DISCOVER with Hi STAR) using Cu—Kα radiation (line focus) as an X-ray source with an output of 1.8 kW (45 kV×40 mA) by 2θ/θ scanning at a slit width of 10 mm×0.1 mm.

Figure 2:
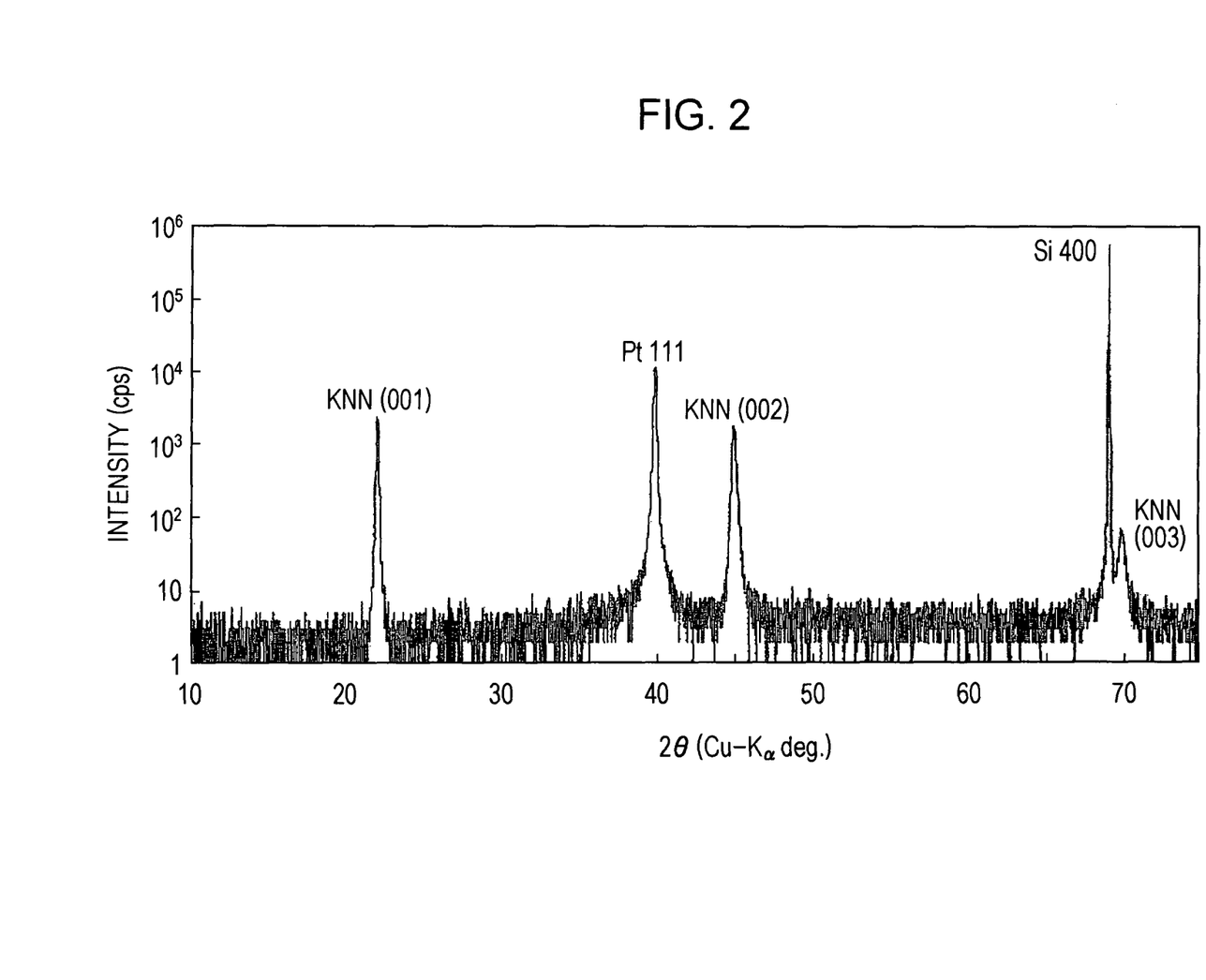
FIG. 2 is an example of a chart showing an X-ray diffraction (XRD) pattern of a piezoelectric thin-film multilayer body according to an embodiment of the present invention in which a piezoelectric thin-film layer has been formed and an upper electrode layer has not yet been formed.

FIG. 2 is an example of a chart showing an XRD pattern of a piezoelectric thin-film multilayer body according to the embodiment in which the piezoelectric thin-film layer has been formed and the upper electrode layer has not yet been formed. As shown in FIG. 2, the lower electrode layer 3 (Pt film) had the (111) preferred orientation. It was confirmed that the piezoelectric thin-film layer 4 (KNN film) had the (001) preferred orientation because diffraction peaks corresponding to only the (001) plane, (002) plane, and (003) plane were observed. A cross-section of the piezoelectric thin-film multilayer body shown in FIG. 1 was observed using a high-resolution scanning electron microscope and, as a result, it was confirmed that the lower electrode layer 3 and the piezoelectric thin-film layer 4 each had an aggregate structure constituted by columnar crystal grains.

The relationship between the thickness of the adhesive layer 2 and the degree of (001) orientation of the piezoelectric thin-film layer 4 was examined. A piezoelectric thin-film multilayer body on which the piezoelectric thin-film layer 4 had been formed and the upper electrode layer 5 had not yet been formed was subjected to an XRD measurement using the same multifunctional high-resolution X-ray diffractometer as used above. The diffraction intensity of the (101) plane due to (001) orientation (i.e., diffraction intensity of the (101) plane when the surface of the piezoelectric thin-film layer 4 is considered to be the (001) plane) was defined as the degree of (001) orientation of the KNN film. Through an XRD measurement, it was found that the KNN film used as the piezoelectric thin-film layer 4 was a pseudocubic polycrystal thin film.

Figure 3:
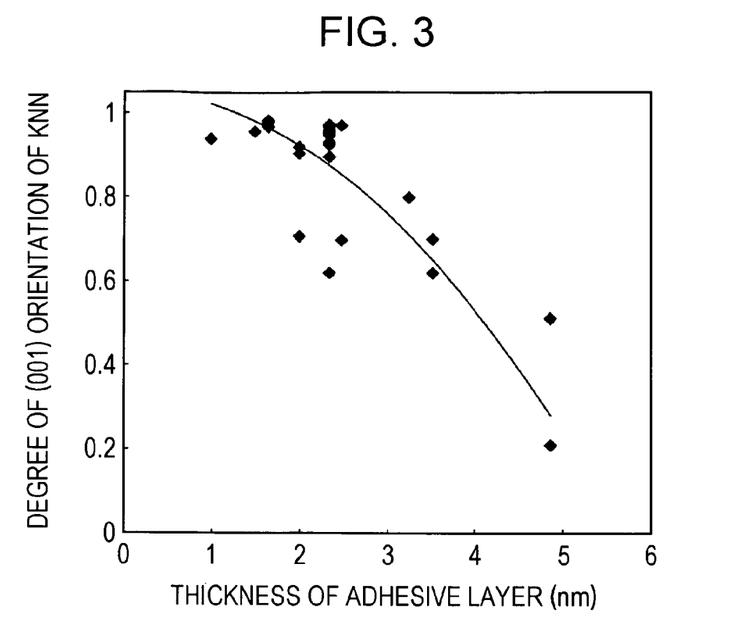
FIG. 3 is a graph showing the relationship between the thickness of the adhesive layer and the degree of (001) orientation of the piezoelectric thin-film layer in the prepared piezoelectric thin-film multilayer body.

FIG. 3 is a graph showing the relationship between the thickness of the adhesive layer and the degree of (001) orientation of the piezoelectric thin-film layer in the prepared piezoelectric thin-film multilayer body. As shown in FIG. 3, the degree of (001) orientation of the piezoelectric thin-film layer 4 (KNN film) increased with a reduction in the thickness of the adhesive layer 2 (Ti oxide film). The piezoelectric constants $d_{33}$ and $-d_{31}$ of a KNN film, which are measures of piezoelectric property, tend to increase with an increase in the degree of (001) orientation thereof. Thus, the piezoelectric property of the piezoelectric thin-film device is considered to be enhanced by reducing the thickness of the adhesive layer 2.

However, it was found that the variations in the degree of (001) orientation of the piezoelectric thin-film layer 4 (KNN film) increased with a reduction in the thickness of the adhesive layer 2 (Ti oxide film). This was an unexpected phenomenon because the arithmetic average roughness Ra of the surface of the substrate 1 used in Study 1 was 0.58 nm and the substrate 1 was considered to have sufficient surface flatness according to existing technical ideas. In addition, in Study 1, the thickness of the adhesive layer 2 was 1.0 to 4.9 nm, which was considered to be sufficiently larger than the arithmetic average roughness Ra of the substrate 1.

On the other hand, in another respect, the thickness of the adhesive layer 2 prepared in Study 1 was smaller than the maximum height Rz (7.5 nm) of the substrate 1. This suggested that maximum height Rz may be a more important measure of the surface roughness of the substrate 1 than arithmetic average roughness Ra.

Study 2

In consideration of the results of Study 1, Study 2 examined how the structure of the substrate of the piezoelectric thin-film multilayer body affects the degree of crystal orientation of the piezoelectric thin-film layer.

Preparation of Piezoelectric Thin-Film Multilayer Body

Substrates similar to that used in Study 1 (a Si substrate including a thermal oxide film) were subjected to surface polishing to prepare substrates 1 having different surface roughness. The surface roughness of each substrate was measured as in Study 1. The substrates prepared had an arithmetic average roughness Ra of 0.58 nm and a maximum height Rz of 7.6 nm; Ra of 0.26 nm and Rz of 5.2 nm; Ra of 0.18 nm and Rz of 2.0 nm; and Ra of 0.16 nm and Rz of 1.9 nm.

As in Study 1, an adhesive layer 2 (thickness of 2.5 nm) was formed on the substrate 1, a lower electrode layer 3 (thickness of 200 nm) was formed on the adhesive layer 2, and a piezoelectric thin-film layer 4 (thickness of 2 μm) was formed on the lower electrode layer 3 by RF magnetron sputtering.

Preferred Orientation of Piezoelectric Thin-Film Layer

Figure 4:
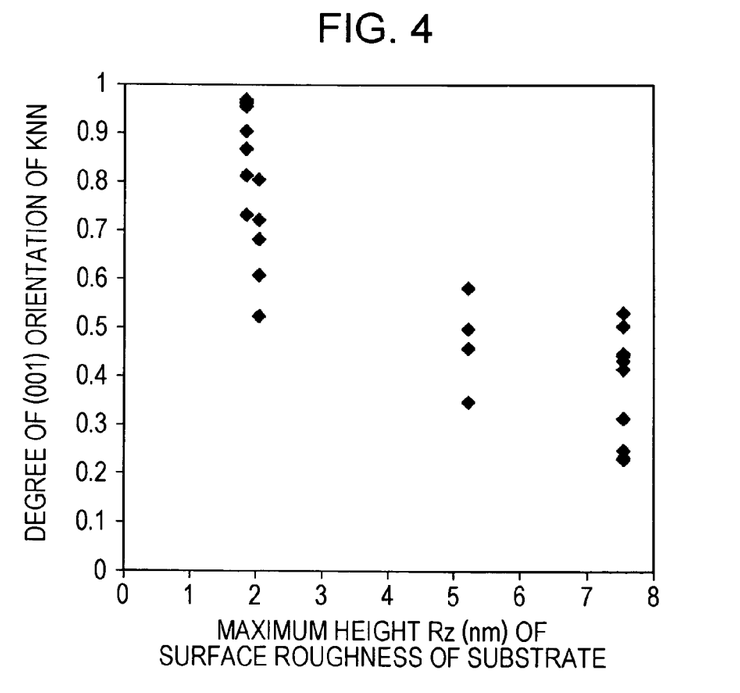
FIG. 4 is a graph showing the relationship between the maximum height Rz of the surface roughness of the substrate and the degree of (001) orientation of the piezoelectric thin-film layer in the prepared piezoelectric thin-film multilayer body.
Figure 5:
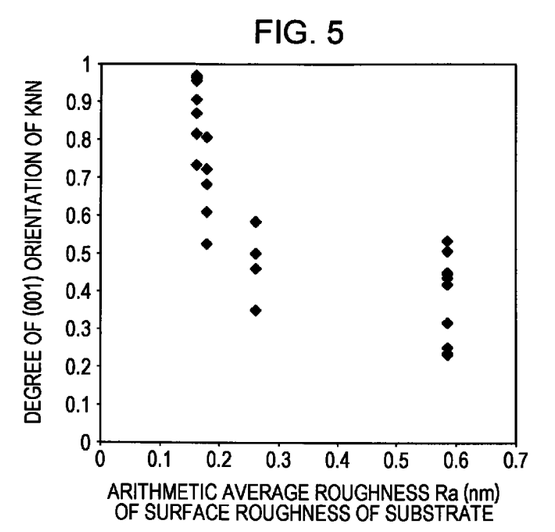
FIG. 5 is a graph showing the relationship between the arithmetic average roughness Ra of the surface roughness of the substrate on which an oxide film is formed and the degree of (001) orientation of the piezoelectric thin-film layer in the prepared piezoelectric thin-film multilayer body.

As in Study 1, the degree of (001) orientation of the piezoelectric thin-film layer 4 was examined. FIG. 4 is a graph showing the relationship between the maximum height Rz of the surface roughness of the substrate and the degree of (001) orientation of the piezoelectric thin-film layer in the prepared piezoelectric thin-film multilayer body. FIG. 5 is a graph showing the relationship between the arithmetic average roughness Ra of the substrate on which an oxide film is formed and the degree of (001) orientation of the piezoelectric thin-film layer in the prepared piezoelectric thin-film multilayer body.

As shown in FIG. 4, the degree of (001) orientation of the piezoelectric thin-film layer 4 (KNN film) increased with a reduction in the maximum height Rz of the surface roughness of the substrate 1. In particular, it was found that the degree of (001) orientation of the KNN film rapidly increased when the maximum height Rz of the surface roughness of the substrate 1 was smaller than the thickness of the adhesive layer 2. Thus, it was considered that the degree of (001) orientation of the piezoelectric thin-film layer 4 is increased by controlling the maximum height Rz of the surface roughness of the substrate 1 to be equal to or less than the thickness of the adhesive layer (in other words, forming the adhesive layer having a thickness equal to or more than the maximum height Rz), which further enhances the piezoelectric property of the piezoelectric thin-film device.

As shown in FIG. 5, in the similar manner as shown in FIG. 4, the degree of (001) orientation of the piezoelectric thin-film layer 4 (KNN film) increased with a reduction in the arithmetic average roughness Ra of the substrate 1. It was found that the arithmetic average roughness Ra of the substrate 1 is preferably 0.18 nm or less. It was considered that the arithmetic average roughness Ra of the substrate 1 is preferably controlled to be 1/10 or less of the thickness of the adhesive layer 2.

Study 3

In Study 3, an experiment was carried out in order to confirm the effect of the combination of the results obtained in Studies 1 and 2 above.

Preparation of Piezoelectric Thin-Film Multilayer Body

The substrate prepared in Study 2, which had a maximum height Rz of 1.9 nm, was used as a substrate 1. As in Study 1, an adhesive layer 2 (thickness of 2.0 nm) was formed on the substrate 1, a lower electrode layer 3 (thickness of 200 nm) was formed on the adhesive layer 2, and a piezoelectric thin-film layer 4 (thickness of 2 μm) was formed on the lower electrode layer 3 by RF magnetron sputtering.

Preferred Orientation of Piezoelectric Thin-Film Layer

As in Study 1, the degree of (001) orientation of the piezoelectric thin-film layer 4 was examined. As a result, it was confirmed that the degree of (001) orientation of KNN was 0.959±0.006, that is, the degree of (001) orientation was higher than that shown in the results in FIG. 3 and the variations in the degree of (001) orientation was smaller than that shown in the results in FIG. 3.

Study 4

In Study 4, a piezoelectric thin-film device was prepared using the above-described piezoelectric thin-film multilayer body, and the piezoelectric property of the piezoelectric thin-film device was examined.

Relationship Between Thickness of Adhesive Layer and Piezoelectric Constant ($d_{33}$) of Piezoelectric Thin-Film Layer An upper electrode layer 5 (thickness of 200 nm) was formed on the piezoelectric thin-film layer 4 of the piezoelectric thin-film multilayer body prepared in Study 3 by RF magnetron sputtering as in the formation of the lower electrode layer 3, that is, using a Pt target (purity: 4 N, diameter of 200 mm) with an input power of 200 W and a substrate temperature of 250° C. in an Ar atmosphere at a pressure of 2.5 Pa. The piezoelectric thin-film multilayer body 10 on which the upper electrode layer 5 was deposited was diced into a chip of a piezoelectric thin-film device.

The piezoelectric constant ($d_{33}$) of the piezoelectric thin-film device was determined using a ferroelectric property evaluation system. Now, the piezoelectric constant used in Examples is briefly explained. In order to determine the piezoelectric constant, generally, physical properties such as Young's modulus, which is an elastic constant of the piezoelectric material, and Poisson's ratio are necessary. However, it is virtually impossible to determine the true Young's modulus or Poisson's ratio of a piezoelectric thin-film layer deposited on a substrate. Thus, in Examples, a piezoelectric constant is calculated using the currently known Young's modulus and Poisson's ratio of a KNN bulk material and is shown in arbitrary units for the purpose of relative comparison.

Figure 6:
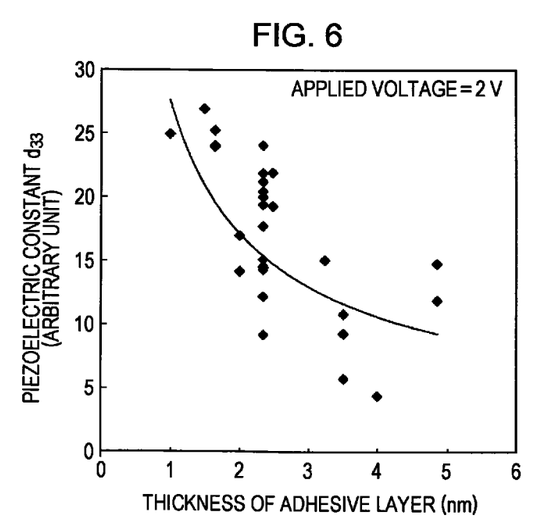
FIG. 6 is a graph showing the relationship between the thickness of adhesive layer and the piezoelectric constant $d_{33}$ of the piezoelectric thin film in the prepared piezoelectric thin-film device (applied voltage of 2 V)

FIG. 6 is a graph showing the relationship between the thickness of the adhesive layer and the piezoelectric constant $d_{33}$ of the piezoelectric thin film in the prepared piezoelectric thin-film device (applied voltage of 2 V). As shown in FIG. 6, the piezoelectric constant $d_{33}$ of the piezoelectric thin-film layer 4 (KNN film) was enhanced with a reduction in the thickness of the adhesive layer 2 (Ti oxide film). This agrees with the tendency shown in FIG. 3. It was considered that the increase in the degree of (001) orientation of the KNN film contributed to the increase in the piezoelectric constant $d_{33}$. It was confirmed that, as shown in Study 3, a test sample including the substrate 1 having a controlled surface roughness and the adhesive layer 2 having a controlled thickness is capable of realizing an enhanced piezoelectric property and reduced variations in piezoelectric property.

Figure 7:
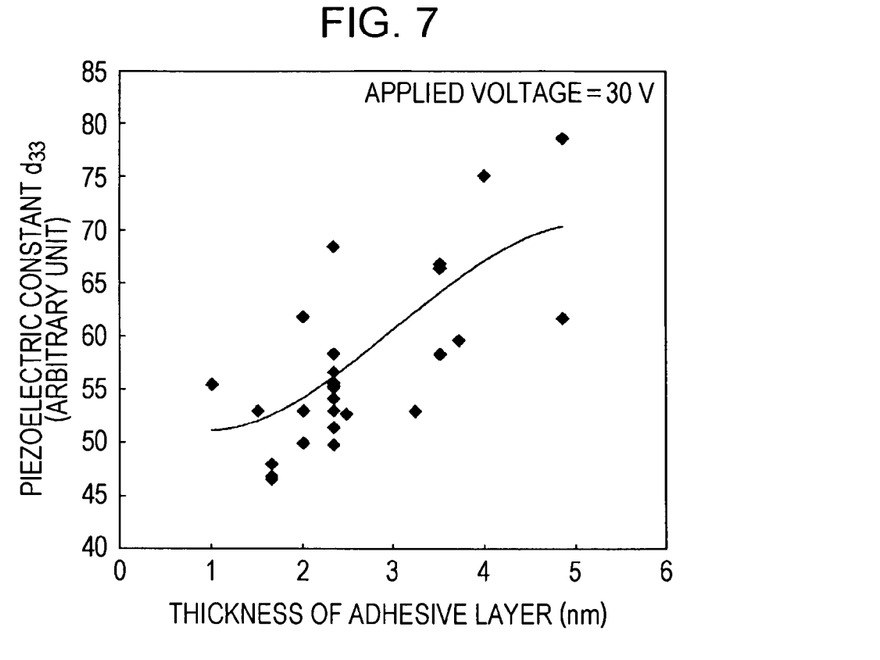
FIG. 7 is a graph showing the relationship between the thickness of adhesive layer and the piezoelectric constant $d_{33}$ of the piezoelectric thin film in the prepared piezoelectric thin-film device (applied voltage of 30 V)

FIG. 7 is a graph showing the relationship between the thickness of adhesive layer and the piezoelectric constant $d_{33}$ of the piezoelectric thin film in the prepared piezoelectric thin-film device (applied voltage of 30 V). As shown in FIG. 7, it was confirmed that the piezoelectric constant $d_{33}$ of the piezoelectric thin-film layer 4 (KNN film) decreased with a reduction in the thickness of the adhesive layer 2 (Ti oxide film), which was a tendency opposite to that observed in FIG. 6, in which the applied voltage was 2 V. This is presumably because the degree of (001) orientation of the KNN film increases with a reduction on the thickness of the adhesive layer 2 (Ti oxide film) and consequently the electrostrictive effect (i.e., increase in deformation at a high voltage) is relatively reduced.

Evaluation on Amount of Change in Piezoelectric Constant/Voltage of Piezoelectric Thin-Film Layer In consideration of a reduction in size and the enhancement of performance required as electronic parts, a piezoelectric device desirably has a large piezoelectric constant at a low voltage and small variations in the piezoelectric constant with a change in voltage from the viewpoints of operation accuracy and operation controllability. In such a piezoelectric device, a peripheral circuit provided for correcting the variation in voltage may have a reduced size or a simplified structure, which contributes to a reduction in the overall size of the piezoelectric part. Thus, the amount of change in piezoelectric constant/voltage of the piezoelectric thin-film layer according to the embodiment was calculated from the results described above (FIGS. 6 and 7). The amount of change in piezoelectric constant/voltage was defined as the amount of change between the piezoelectric constant observed at an applied voltage of 2 V and the piezoelectric constant observed at an applied voltage of 30 V as shown in Expression (1) below.

Amount of Change in Piezoelectric Constant/Voltage ($V^{-1}$)=(Piezoelectric Constant Observed at Applied Voltage of 30 V−Piezoelectric Constant Observed at Applied Voltage of 2 V)/28    (1)

Figure 8:
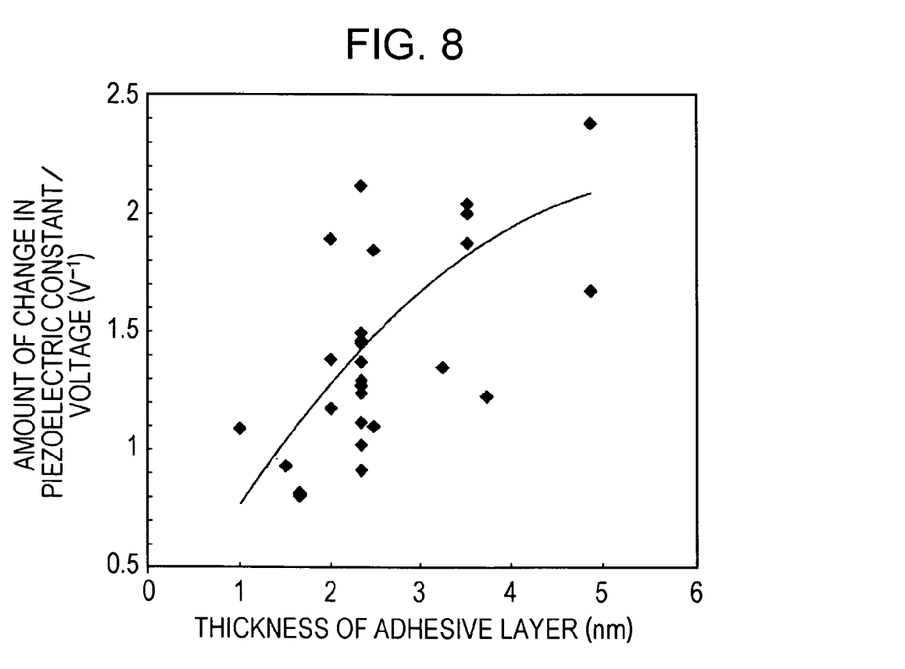
FIG. 8 is a graph showing the relationship between the thickness of adhesive layer and a change in piezoelectric constant/voltage of the piezoelectric thin film in the prepared piezoelectric thin-film device.

FIG. 8 is a graph showing the relationship between the thickness of adhesive layer and a change in piezoelectric constant/voltage of the piezoelectric thin film in the prepared piezoelectric thin-film device. FIG. 8 shows that the amount of change in piezoelectric constant/voltage decreased with a reduction in the thickness of the adhesive layer 2 (i.e., thickness of the Ti oxide film). This result shows that a piezoelectric thin-film device including an adhesive layer 2 having a reduced thickness is more preferable from the viewpoints of reduction in the size, operation accuracy, and operation controllability of an electronic part. As shown in the results of Study 3, it was confirmed that a test sample including a substrate 1 having a controlled surface roughness and an adhesive layer 2 having a controlled thickness has small variations in the amount of change in piezoelectric constant/voltage.

Meanwhile, it was confirmed that, when a Zr oxide film or a Hf oxide film was formed as the adhesive layer 2 instead of a Ti oxide film in the above-described Studies, the effect similar to that produced by the Ti oxide film was produced. It was also confirmed that, when LKNN was used as the material of the piezoelectric thin-film layer 4 instead of KNN used in the above-described Studies, the effect similar to that produced by a piezoelectric thin-film layer composed of KNN was produced.

As is described above, according to an embodiment of the present invention, a piezoelectric thin-film multilayer body including a lead-free piezoelectric material, which realizes enhanced piezoelectric property and small variations in piezoelectric property among devices and a piezoelectric thin-film device including the piezoelectric thin-film multilayer body may be provided. A high performance, downsized system device (e.g., MEMS device) that allows a reduction in the environmental load may be realized by utilizing the piezoelectric thin-film device according to the embodiment of the present invention.

The detailed description of the embodiments and Examples above are provided in order to assist in the understanding of the present invention. The present invention is not limited to a piezoelectric thin-film multilayer body including all components described above. For example, a part of the components of a piezoelectric thin-film multilayer body described in an example may be replaced with the components of a piezoelectric thin-film multilayer body described in another example. In another case, the components of a piezoelectric thin-film multilayer body described in an example may be combined with the components of a piezoelectric thin-film multilayer body described in another example. Furthermore, a part of the components of a piezoelectric thin-film multilayer body described in each example may be omitted, replaced with other components, and combined with other components.

Although the invention has been described with respect to specific exemplary embodiments for complete and clear disclosure, the appended claims are not to be thus limited but are to be construed as embodying all modifications and alternative constructions that may occur to one skilled in the art which fairly fall within the basic teaching herein set forth.

Further, it is noted that Applicant's intent is to encompass equivalents of all claim elements, even if amended later during prosecution.

What is claimed is:

1. A piezoelectric thin-film multilayer body comprising:
   a substrate;
   an adhesive layer on the substrate;
   a lower electrode layer on the adhesive layer; and
   a lead-free piezoelectric thin-film layer on the lower electrode layer,
   wherein the lead-free piezoelectric thin-film layer is composed of lithium potassium sodium niobate (composition formula $(Na_xK_yLi_z)NbO_3$, $0<x<1$, $0<y<1$, $0 \leq z \leq 1$, $x+y+z=1$),
   wherein a maximum height Rz of a roughness of an adhesive-layer-facing surface of the substrate is 2 nm or less,
   wherein the adhesive layer is composed of a non-crystalline oxide of a Group 4 element or a non-crystalline oxide of a Group 5 element, and
   wherein the adhesive layer has a thickness of 1 nm or more and 2 nm or less and is equal to or more than the maximum height Rz of the roughness of the surface of the substrate.

2. The piezoelectric thin-film multilayer body according to claim 1,
   wherein an arithmetic average roughness Ra of the roughness of the surface of the substrate is 0.18 nm or less.

3. The piezoelectric thin-film multilayer body according to claim 1,
   wherein the lower electrode layer has a (111) preferred orientation.

4. The piezoelectric thin-film multilayer body according to claim 1,
   wherein the Group 4 element constituting the adhesive layer is titanium (Ti).

5. The piezoelectric thin-film multilayer body according to claim 1,
   wherein the lower electrode layer is composed of platinum (Pt) or a platinum (Pt) alloy.

6. The piezoelectric thin-film multilayer body according to claim 1,
   wherein the substrate is any one selected from a silicon (Si) substrate, a silicon-on-insulator (SOI) substrate, a germanium (Ge) substrate, a magnesium oxide (MgO) substrate, a zinc oxide (ZnO) substrate, a strontium titanate ($SrTiO_3$) substrate, a strontium ruthenate ($SrRuO_3$) substrate, a sapphire ($Al_2O_3$) substrate, a gallium arsenide (GaAs) substrate, a gallium nitride (GaN) substrate, a glass substrate, and a quartz glass substrate.

7. A piezoelectric thin-film device comprising the piezoelectric thin-film multilayer body according to claim 1.

8. A piezoelectric thin-film multilayer body comprising:
   a substrate;
   an adhesive layer on the substrate;
   a lower electrode layer on the adhesive layer; and
   a lead-free piezoelectric thin-film layer on the lower electrode layer,
   wherein the lead-free piezoelectric thin-film layer is composed of a ferroelectric having a perovskite structure,
   wherein a maximum height Rz of a roughness of an adhesive-layer-facing surface of the substrate is 2 nm or less,
   wherein the adhesive layer is composed of a non-crystalline oxide of a Group 4 element or a non-crystalline oxide of a Group 5 element, and
   wherein the adhesive layer has a thickness of 1 nm or more and 2 nm or less and is equal to or more than the maximum height Rz of the roughness of the surface of the substrate.

9. The piezoelectric thin-film multilayer body according to claim 8,
   wherein arithmetic average roughness Ra of the roughness of the surface of the substrate is 0.18 nm or less.

* * * * *